United States Patent [19]
Hofer

[11] Patent Number: 4,922,853
[45] Date of Patent: May 8, 1990

[54] STRIPE COATING ON GLASS BY CHEMICAL VAPOR DEPOSITION

[75] Inventor: Peter H. Hofer, Perrysburg, Ohio

[73] Assignee: Libbey-Owens-Ford Co., Toledo, Ohio

[21] Appl. No.: 352,748

[22] Filed: May 16, 1989

[51] Int. Cl.$^5$ ............................................. C23C 16/44
[52] U.S. Cl. ...................................... 118/718; 65/60.1; 118/733; 427/166; 427/255; 427/255.5
[58] Field of Search ....................... 65/32.4, 60.1, 60.4, 65/60.51, 60.52, 60.7, 60.8; 118/718, 733; 427/109, 163, 166, 251, 255, 255.2, 255.5, 286

[56] References Cited

U.S. PATENT DOCUMENTS

| | | | |
|---|---|---|---|
| 4,469,045 | 9/1984 | Chesworth | 118/718 |
| 4,612,217 | 9/1986 | Gordon | 65/60.1 |
| 4,681,776 | 7/1987 | Bok | 427/255.5 |
| 4,793,282 | 12/1988 | Greenberg et al. | 118/718 |
| 4,857,097 | 8/1989 | Berry | 427/255.5 |

FOREIGN PATENT DOCUMENTS 62-120481  6/1987  Japan ................................... 118/733

Primary Examiner—Richard Bueker
Assistant Examiner—Terry J. Owens
Attorney, Agent, or Firm—Marshall & Melhorn

[57] ABSTRACT

A chemical vapor deposition coater, for depositing a stripe of coating material onto a hot glass substrate, comprises a coater body, including upstream, downstream, and side evacuation ducts, seal means for preventing CVD reactant from contaminating the atmosphere exterior to the coater, and independently controlled evacuation means for removing spent reactant from the reaction zone in such a manner so as to produce a stripe of coating material having a uniform thickness across the width thereof.

6 Claims, 1 Drawing Sheet

STRIPE COATING ON GLASS BY CHEMICAL VAPOR DEPOSITION

FIELD OF THE INVENTION

This invention relates generally to the chemical vapor deposition (CVD) of coatings onto glass substrates, and more particularly, to an apparatus and method for the application, by chemical vapor deposition, of a coating in the configuration of a stripe onto glass during its manufacture by the float glass process.

BACKGROUND OF THE INVENTION

Chemical vapor deposition processes are used to continuously coat glass substrates while the glass is being manufactured in what is generally known in the art as the float glass process. The float glass process typically involves casting glass onto a molten tin bath which is suitably enclosed, then transferring the glass, after it has sufficiently cooled, to lift out rolls which are aligned with the bath, and finally cooling the glass as it advances across the rolls through a lehr. The chemical vapor deposition of various coatings may conveniently be performed in the bath, the lehr, or the transition zone therebetween.

Chemical vapor deposition generally involves the formation of a metal, metal compound, or metal oxide coating, or combination thereof, on a surface of a hot glass substrate by contacting the surface with a gaseous mixture or precursor containing a vaporized substance which undergoes a chemical reaction or decomposition. Such coatings are generally applied to modify the apparent color or solar characteristics of the glass, such as in the application of a reflection/absorption filter band to an automobile windshield, or to impart electrical conductance to the surface of the glass. One such use for the latter mentioned coating is the production of a rain sensor on the exterior surface of an automotive windshield.

Occasionally, the area which must be coated is substantially smaller than the entire surface of the glass ribbon produced by the float glass process. Such an example is the small area which must be coated in order to produce the aforementioned rain sensor, in relation to the total surface area of an automotive windshield. It is generally known that a rain sensor may be prepared by coating the entire glass surface with a doped tin oxide coating to a 100 ohm/square conductivity utilizing a conventional float glass process CVD coater which spans the entire width of the glass ribbon, and thereafter removing, by etching or vaporizing, the unwanted portion of the conductive coating. This, however, is wasteful of coating chemicals and etching solutions, and unnecessarily increases the time required to produce a windshield having a rain sensor.

One solution to this dilemma might be to apply a coating of the required material in the form of a stripe on the continuously produced glass ribbon manufactured by the float glass process. Then the amount of coating to be removed from the finished article would be greatly reduced. However, a conventional CVD coater could not be used because it is designed to "ride" on the edges of the glass ribbon, utilizing such as for example carbon fiber seals which contact and slide over the advancing glass ribbon. These edge portions of the glass, which are marred by contact with the coater side seals, are later removed. Generally, the front and back edges of a conventional CVD coater are each superposed over the top surface of the advancing glass ribbon, thereby defining narrow gaps through which gases exterior from the coater may be drawn so as not to contaminate the controlled atmosphere within the float glass facility. This is particularly important when CVD coating a metal oxide within the bath, where the molten tin might otherwise be contaminated by CVD oxidation reactants. If such a conventional coater were modified to produce only a stripe of CVD coated material, the defects caused by the side seals sliding on either side of the applied stripe would render the entire glass ribbon useless.

U.S. Pat. No. 4,776,298 discloses an apparatus for performing plasma enhanced chemical vapor deposition of a metal oxide coating at the edge of a polycarbonate sheet. The seal which maintains the CVD reactants within the deposition zone, however, is formed by contact between the coater body and the polycarbonate sheet surface. Therefore, such a device could not be utilized in conjunction with the float glass process without damaging the surface of the glass upon which the seal rests.

U.S. Pat. No. 4,278,528 discloses a method and apparatus for applying stripes of coating material onto a moving substrate, by a sputtering technique in which a mask, defining the widths of the stripes, is interposed between the targets and the anodes.

U.S. Pat. No. 4,562,093 discloses a process for the production of glass sheets for windshields having a reflection/absorption filter band thereon, using a cathode atomization sputtering apparatus and a shutter arrangement to adjust the width of the deposited stripes.

It would be desirable to construct a coater apparatus which could be used to apply a stripe of coating material onto an advancing glass ribbon being produced by the float glass process, by chemical vapor deposition, which apparatus would not contact and thereby mar the surface of the glass, nor utilize inconvenient masks or shutters, and which would provide a seal so as to prevent the escape of vaporized reactants to the exterior of the coater.

It must be noted that the prior art referred to herein above has been collected and reviewed only in light of the present invention as a guide. It is not to be inferred that such diverse art would otherwise be assembled absent the motivation provided by the present invention.

SUMMARY OF THE INVENTION

Accordant with the present invention, it has surprisingly been discovered that an apparatus may be constructed for the application, by chemical vapor deposition, of a coating material in the configuration of a stripe onto glass during its manufacture by the float glass process, the apparatus comprising:

(A) a coater body, adapted for positioning adjacent a surface of an advancing hot glass substrate, defining a reaction zone therebetween wherein a reactant or precursor may contact the surface of the hot glass substrate and deposit a coating material thereon;

(B) a reactant supply conduit, for admitting a flow of the reactant to the reaction zone;

(C) an upstream exhaust duct, for evacuating a portion of the reactant flow from the reaction zone, at a point upstream from the reactant supply conduit;

(D) a downstream exhaust duct, for evacuating a portion of the reactant flow from the reaction zone, at a point downstream from the reactant supply conduit;

(E) left and right evacuation ducts, for evacuating a portion of the reactant flow from the reaction zone, at points on opposite sides of the reactant supply conduit in directions transverse to the movement of the glass substrate, the distance between the left and right exhaust ducts substantially defining the width of the stripe of coating material;

(F) seal means for preventing the escape of reactant from the reaction zone out between the coater body and the surface of the hot glass substrate; and (G) evacuation means for independently controlling the evacuation of the flow of reactant through the upstream exhaust duct, the flow of reactant through the downstream exhaust duct, and the combined flows of reactant through the left and right exhaust ducts, in such a manner so as to cause the deposition of a stripe of coating material having a substantially uniform thickness across the width thereof.

This apparatus is useful, for example, for depositing a stripe of conductive tin oxide onto glass, from which windshields having rain sensors thereon may economically be produced.

BRIEF DESCRIPTION OF THE DRAWINGS

The novel features that are considered characteristic of the invention are set forth with particularity in the appended claims. The invention itself, however, both as to structure and method of use, will best be understood from the accompanying description of a specific embodiment, when read in connection with the attendant drawings, in which:

DETAILED DESCRIPTION OF THE PREFERRED EMBODIMENT

Figure 1:
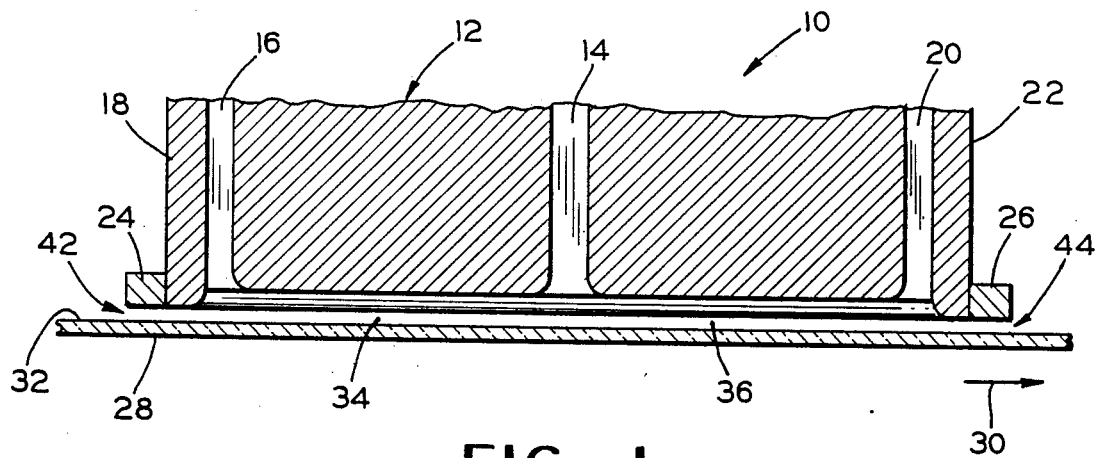
FIG. 1 is a cross sectional view of a portion of a chemical vapor deposition coater, taken along line 1—1 of FIG. 3, embodying the features of the present invention, and illustrating the relative positioning of the coater adjacent the advancing glass substrate during operation.

Referring now to FIG. 1, there is shown generally at 10 a cross section of a portion of a chemical vapor deposition coater, embodying the features of the present invention. The coater includes a body 12, a reactant supply conduit 14 extending generally vertically through the body 12, an upstream exhaust duct 16 extending vertically through the body 12 near the front surface 18 of the body 12, a downstream exhaust duct 20 extending vertically through the body 12 near the rear surface 22 of the body 12, and upstream and downstream shoes 24 and 26, respectively, affixed to the front and rear surfaces 18 and 22, respectively, of the coater body 12. The reactant supply conduit 14 is disposed generally intermediately between the upstream and downstream exhaust ducts 16 and 20, respectively, and is adapted to admit a flow of CVD reactant to the reaction zone which comprises an upstream reaction zone 34 and a downstream reaction zone 36. The upstream 16 and downstream 20 evacuation ducts are designed to evacuate a portion of the flow of (spent) reactant and reaction products from the upstream 34 and downstream 36 reaction zones, respectively, at points upstream and downstream, respectively, from the reactant supply conduit 14.

In operation, the coater 10 is positioned adjacent (but not contacting) a hot glass substrate 28, typically as it is being manufactured by the conventional float glass process, and which is illustrated in FIG. 1 as moving in the direction indicated by arrow 30. By the terms upstream and downstream, as generally used herein, is meant the position of any particular feature of the coater or float glass facility in relationship generally horizontally to the reactant supply conduit 14. Those features positioned in the direction from which the advancing glass substrate 28 approaches the reactant supply conduit 14 lie upstream; those features in the opposite direction lie downstream from the conduit 14.

The region between the surface 32 of the glass and the coater body 12, extending generally from the reactant supply conduit 14 to the upstream exhaust duct 16, and between the left and right exhaust ducts (not specifically shown in FIG. 1), defines an upstream reaction zone 34. Similarly, the region between the surface 32 of the glass and the coater body 12, extending generally from the reactant supply conduit 14 to the downstream exhaust duct 20, and between the left and right exhaust ducts (not specifically shown in FIG. 1), defines a downstream reaction zone 36. As explained herein above, the upstream 34 and downstream 36 reaction zones together define an area generally referred to herein as the reaction zone. Although illustrated in FIG. 1 as such, the upstream 34 and downstream 36 reaction zones need not be symmetrical.

Shoes 24 and 26 cooperate with adjoining front and rear surfaces 18 and 22, respectively, of the coater body 12, and with the surface 32 of the glass substrate 28, to form narrow passageways 42 and 44, respectively, through which the atmosphere external to the reaction zones 34 and 36 is drawn during the normal operation of the coater 10.

Figure 2:
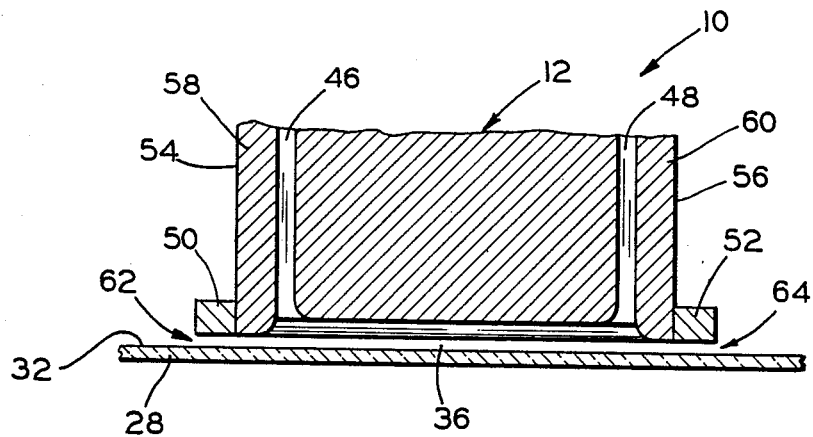
FIG. 2 is a cross-sectional view of a portion of the coater of FIG. 1, taken along line 2—2 of FIG. 3, illustrating the configuration of the side exhaust ducts which substantially define the width of the stripe of coating material.
Figure 3:
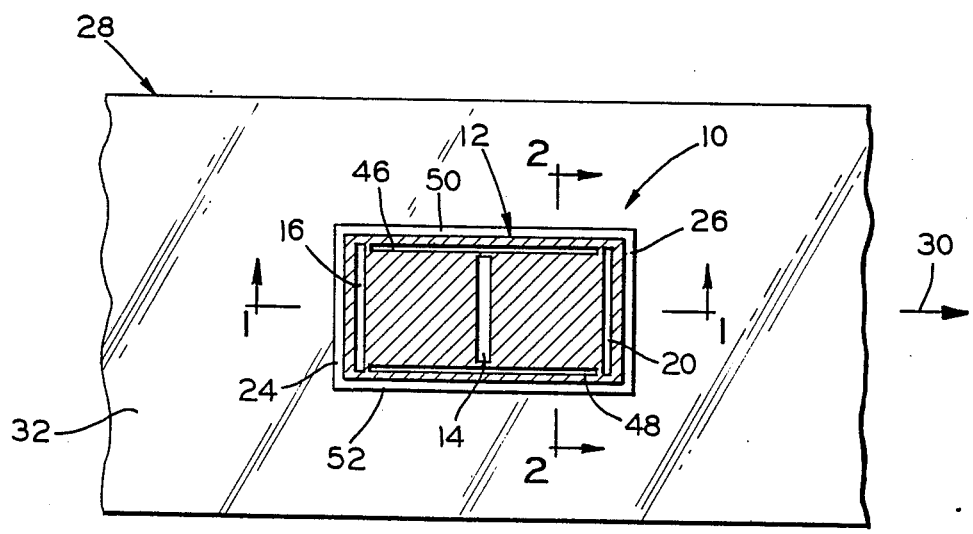
FIG. 3 is a top cross-sectional view of a portion of the coater of FIGS. 1 and 2, illustrating the relative placement of the exhaust ducts and the intermediately disposed reactant supply conduit.

Referring now to FIG. 2, there is shown a cross-sectional view of a portion of the chemical vapor deposition coater illustrated in FIG. 1, taken along line 2—2 of FIG. 3. FIG. 2 illustrates the coater body 12, including a left exhaust duct 46 extending vertically through the body 12, a right exhaust duct 48 extending vertically through the body 12, and left and right shoes 50 and 52, respectively, affixed to the left and right surfaces 54 and 56, respectively, of the coater body 12. The left 46 and right 48 exhaust ducts are designed to allow the evacuation of a portion of the flow of (spent) reactant and reaction products from the upstream 34 and downstream 36 reaction zones, at points on opposite sides of the reactant supply conduit 14 in directions transverse to the movement of the glass substrate 28. Shoes 50 and 52 cooperate with adjoining left and right walls 58 and 60, respectively, of the coater body 12, and with the surface 32 of the glass substrate 28, to form narrow passageways 62 and 64, respectively, through which the atmosphere external to the reaction zones 34 and 36 is drawn during the normal operation of the coater 10.

Shoes 24, 26, 50, and 52 are superposed above, and cooperate with, the surface 32 of the glass substrate 28 to form a seal around the perimeter of the reaction zone, which prevents the escape of reactant from the reaction zone, out between the coater body 12 and the surface 32 of the glass 28, through passageways 42, 44, 62, and 64, respectively. This is accomplished by evacuating the reaction zone in such a manner so as to insure a slight, constant flow of the atmosphere external to the coater, through passageways 42, 44, 62, and 64, into the perimeter area of the reaction zone, thence into the exhaust ducts 16, 20, 46, and 48.

FIG. 3 is a top cross sectional view of a portion of the chemical vapor deposition coater of FIGS. 1 and 2, illustrating the coater body 12, the upstream and downstream exhaust ducts 16 and 20, respectively, and the left and right exhaust ducts 46 and 48, respectively. Also shown is the intermediately disposed reactant supply conduit 14, and the shoes 24, 26, 50, and 52.

As is evident from FIGS. 1 and 2, the upstream reaction zone 34 communicates with the reactant supply conduit 14, and the upstream, left, and right exhaust ducts 16, 46, and 48, respectively. Likewise, the downstream reaction zone 36 communicates with the reactant supply conduit 14, and the downstream, left, and right exhaust ducts 20, 46, and 48, respectively. In operation, a chemical vapor deposition reactant is admitted to the reaction zones 34 and 36 through the reactant supply conduit 14. The reactant vapor flows through the reaction zones, generally in an upstream direction through the upstream reaction zone 34, and generally in a downstream direction through the downstream reaction zone 36. During passage of the CVD reactant through the reaction zones, a coating is deposited onto the surface 32 of the moving glass substrate 28. Spent reactant and products of the reaction between the hot glass and reactant is exhausted from the reaction zones through the upstream, downstream, left, and right exhaust ducts 16, 20, 46, and 48, respectively.

The coater 10 of the present invention is particularly useful for applying metal oxide coatings in the bath section of a conventional float glass facility. A non-oxidizing atmosphere is maintained in the bath so as not to contaminate the molten metal upon which the glass is cast. The use of CVD technology for applying a metal oxide coating involves the use of an oxidizing atmosphere in the reaction zone of the coater. It is clear, therefore, that the oxidizing atmosphere within the coater reaction zone must be prevented from escaping into, and contaminating, the non-oxidizing atmosphere of the bath section of the float glass facility. The coater 10 of the present invention is conveniently adapted to prevent leakage of the reactant within the reaction zones 34 and 36 into the atmosphere external to the coater 10, utilizing the perimeter shoe seals as explained herein above.

The means for controlling the evacuation of the spent CVD reactant through the exhaust ducts 16, 20, 46, and 48 may be any of the means known generally in the glass making and coating art for drawing a controlled vacuum, such as for example by using conventional exhaust blowers in series with associated flow regulating means, e.g., valves or dampers (not shown). The controlled evacuating means independently communicate with the upstream 16 and downstream 20 exhaust ducts, and the combined flows from the left 46 and right 48 exhaust ducts.

Of particular importance in the present invention is the necessity for using independently controlled exhaust means (not shown) for the upstream exhaust duct 16, the downstream exhaust duct 20, and the combined flows of the left and right exhaust ducts 46 and 48, respectively. Such independently controlled exhaust means are necessitated by the differences in the upstream and downstream flow characteristics of the CVD reactant caused by the moving glass substrate 28, variations in the speed of the moving glass substrate 28, the desire for the deposition of a coating which is uniform across the width of the stripe which might otherwise vary if the vacuum created by the left and right exhaust ducts were too great, variations in the vertical dimensions of the narrow passageways 42, 44, 62, and 64, etc. The independently controlled exhaust means may, of course, comprise a single exhaust blower and individual, independent flow regulating means.

The independently controlled exhaust means are to be operated in such a manner so as to cause the deposition of a stripe of CVD coating material on the advancing glass substrate, having a uniform thickness and quality across the width of the stripe. The independently controlled exhaust means must, therefore, be operated in such a manner so that the slight flow of atmosphere external to the coater 10 drawn through the narrow passageways 42, 44, 62, and 64 substantially has no effect upon the coating reaction occurring within the reaction zones 34 and 36.

The coater 10 may be positioned at any location across the width of the advancing glass substrate 28, so as to produce for example a stripe of coating material down the center or near either edge of the glass substrate 28. Multiple coaters 10 may, of course, be utilized to form multiple parallel stripes of coating material on the glass substrate.

The width of the stripe is defined substantially by the distance between the left and right exhaust ducts 46 and 48. Therefore, a wider or narrower stripe of coating material may be produced using a coater 10 having a greater or lesser dimension between these side exhaust ducts.

Coating materials and precursors which may be deposited upon the surface of a hot glass substrate, or may be deposited over previously supplied coatings coating materials, include metal coatings, metal compound coatings, metal oxide coatings, etc. These coatings are deposited by contacting the hot glass surface with a gaseous CVD reactant, containing a vaporized substance, in either an oxidizing or non-oxidizing gas mixture, which chemically reacts or decomposes at the surface of the glass to form the coating material.

An example of a metal coating which may be deposited utilizing the coater 10 of the present invention is silicon. Typically, a reactant comprising a non-oxidizing atmosphere containing a silane is reacted at or near the surface upon which the silicon layer is to be deposited. Specific methods for preparing a silicon coating by CVD technology are disclosed in U.S. Pat. No. 4,188,444, which is hereby incorporated in its entirely by reference thereto.

A metal compound coating such as for example titanium nitride may be deposited onto glass, by supplying to the coater 10 of the present invention a reactant comprising titanium tetrahalide and a reducing agent. Specific methods for preparing such coatings are set forth more fully in U.S. Pat. No. 4,545,000, which is hereby incorporated in its entirely by reference thereto.

Preferably, the coater 10 of the present invention is utilized to deposit a stripe of a metal oxide coating, such as tin oxide, titanium oxide, aluminum oxide, and the like, onto a hot glass substrate advancing through the bath section of a float glass process facility. These metal oxide coatings are prepared by the decomposition of a reactant comprising an organometallic or other metallic compound, or mixtures thereof, with or without a suitable dopant, e.g., freon, in an oxidizing atmosphere, at or near the surface of the hot glass substrate. Convenient organometallic compounds include dimethyltin dichloride, tetramethyl tin, tetrabutyl titanate, triethyl aluminum, and the like. Examples of oxidizing atmospheres are water vapor, steam, air, and oxygen.

For the proper deposition of a stripe of coating material, utilizing the coater 10 of the present invention, the glass substrate 28 will generally have a temperature of at least 925° F. The temperature will, of course, be much higher if the coater is operated within the bath section of a float glass facility, where the temperature is generally in the 1,200° F. range.

The invention is more easily comprehended by reference to the specific embodiments described hereinabove, which are representative of the invention. It must be understood, however, that the specific embodiments are provided only for the purpose of illustration, and that the invention may be practiced otherwise that as specifically illustrated without departing from its spirit and scope.

What is claimed is:

1. A chemical vapor deposition coater for depositing a stripe of coating material onto glass, comprising:
   (A) a coater body adapted for positioning adjacent a surface of an advancing hot glass substrate, defining a reaction zone therebetween wherein a reactant may contact the surface of the hot glass substrate and deposit a coating material thereon;
   (B) a reactant supply conduit for admitting a flow of the reactant to the reaction zone;
   (C) an upstream exhaust duct for evacuating a portion of the reactant flow from the reaction zone at a point upstream from the reactant supply conduit;
   (D) a downstream exhaust duct for evacuating a portion of the reactant flow from the reaction zone at a point downstream from the reactant supply conduit;
   (E) left and right evacuation ducts for evacuating a portion of the reactant flow from the reaction zone at points on opposite sides of the reactant supply conduit in directions transverse to the movement of the glass substrate, the distance between the left and right exhaust ducts substantially defining the width of the stripe of coating material;
   (F) seal means for preventing the escape of reactant from the reaction zone out between the coater body and the surface of the hot glass substrate; and
   (G) evacuation means for independently controlling the evacuation of the flow of reactant through the upstream exhaust duct, the flow of reactant through the downstream exhaust duct, and the combined flows of reactant through the left and right exhaust ducts, in such a manner so as to cause the deposition of a stripe of coating material having a substantially uniform thickness across the width thereof.

2. The chemical vapor deposition coater according to claim 1, wherein the seal means includes shoes, superposed above and cooperating with the surface of the glass substrate, positioned around the perimeter of the reaction zone to define passageways therebetween through which atmosphere external to the coater is drawn during normal operation of the coater.

3. The chemical vapor deposition coater according to claim 1, wherein the evacuation means includes independently controlled exhaust blowers in series with associated flow regulating means.

4. The chemical vapor deposition coater according to claim 1, wherein the evacuation means includes a singular exhaust blower, and individual, independently controlled flow regulating means.

5. The chemical vapor deposition coater according to claim 1, wherein the reactant supply conduit is located generally intermediately of the upstream and downstream exhaust ducts.

6. A process for depositing, by chemical vapor deposition, a stripe of coating material onto glass, comprising the steps of:
   (A) providing an advancing hot glass substrate;
   (B) providing a coater body adapted for positioning adjacent a surface of the hot glass substrate, defining a reaction zone therebetween wherein a reactant may contact the surface of the hot glass substrate;
   (C) admitting a flow of the reactant to the reaction zone;
   (D) evacuating the reactant flow from the reaction zone simultaneously at locations upstream, downstream, and in both directions transverse to the direction of movement of the hot glass substrate, relative to the position at which the reactant is admitted to the reaction zone;
   (E) providing seal means for preventing the escape of reactant from the reaction zone out between the coater body and the surface of the hot glass substrate; and
   (F) independently controlling the evacuation flows of reactant from the location upstream, the location downstream, and the combined locations in both directions transverse to the direction of movement of the hot glass substrate, in such a manner so as to cause the deposition of a stripe of coating material having a substantially uniform thickness across the width thereof.

* * * * *